United States Patent [19]
Joshi et al.

[11] Patent Number: 5,853,500
[45] Date of Patent: Dec. 29, 1998

[54] METHOD FOR FABRICATING THIN FILMS OF BARIUM STRONTIUM TITANATE WITHOUT EXPOSURE TO OXYGEN AT HIGH TEMPERATURES

[75] Inventors: Vikram Joshi; Carlos A. Paz de Araujo, both of Colorado Springs, Colo.

[73] Assignee: Symetrix Corporation, Colorado Springs, Colo.

[21] Appl. No.: 896,574

[22] Filed: Jul. 18, 1997

[51] Int. Cl.⁶ ....................................... B05D 5/12
[52] U.S. Cl. .................... 148/247; 148/284; 148/537; 427/126.3
[58] Field of Search ................... 148/247, 284, 148/537; 427/126.1, 126.3

[56] References Cited

U.S. PATENT DOCUMENTS

| | | | |
|---|---|---|---|
| 5,514,822 | 5/1996 | Scott et al. | 427/126.3 |
| 5,561,307 | 10/1996 | Mihara et al. | 257/295 |
| 5,614,252 | 3/1997 | McMillan et al. | 427/126.1 |
| 5,620,739 | 4/1997 | Azuma et al. | 427/126.3 |
| 5,624,707 | 4/1997 | Azuma et al. | 427/126.3 |
| 5,680,092 | 10/1997 | Yamada et al. | 338/309 |
| 5,723,361 | 3/1998 | Azuma et al. | 427/377 |

OTHER PUBLICATIONS

*ASM Handbook*, vol. 4, Heat Treating, pp. 542–567, "Furnace Atmospheres," ASM, 1991.

*Primary Examiner*—George Wyszomierski
*Attorney, Agent, or Firm*—Duft, Graziano & Forest, P.C.

[57] ABSTRACT

A liquid precursor containing barium, strontium, and titanium, is applied to a first electrode, dried in air at a first temperature of 160° C. and then a second temperature of 400° C., and annealed at a temperature of 800° C. in nitrogen to form a thin film of barium strontium titanate. A second electrode is deposited and then the device is patterned to form a capacitor, and a second anneal is performed at a temperature of 800° C. in nitrogen. In this manner, a high electronic quality thin film of barium strontium titanate is fabricated without a high-temperature oxygen anneal.

25 Claims, 5 Drawing Sheets

METHOD FOR FABRICATING THIN FILMS OF BARIUM STRONTIUM TITANATE WITHOUT EXPOSURE TO OXYGEN AT HIGH TEMPERATURES

BACKGROUND OF THE INVENTION

1. Field of the Invention

The invention in general relates to the fabrication of thin films of barium strontium titanate, and more particularly to fabrication processes that provide high dielectric constant integrated circuit devices without exposure to oxygen at high temperatures.

2. Statement of the Problem

Barium strontium titanate ("BST") is recognized as a material having potentially important uses in integrated circuits. See, "A Stacked Capacitor With $(Ba_xSr_{1-x})TiO_3$ For 256M DRAM" in IEDM(International Electron Devices Meeting) *Technical Digest,* Dec. 1991, pp. 32.1.1–32.1.4. There are known methods for depositing thin films of BST, such as sputtering, as disclosed in the above cited references and liquid precursor deposition as disclosed in U.S. Pat. No. 5,514,822 issued on May 7, 1996 to Michael C. Scott et al. The processes for fabricating BST layers described in the prior art all include high temperature oxygen anneals, i.e., anneals in oxygen at temperatures 500° C. and higher. According to all the prior art relating to the fabrication of BST layers, high temperature anneals in oxygen are required to produce a high dielectric constant and other electronic properties which are necessary for use of these materials in integrated circuits.

While fabricating processes using high temperature anneals in oxygen do produce BST layers with excellent electrical properties for use in integrated circuits, they also have significant deleterious effects on many conventional integrated circuit materials. For example, materials such as polycrystalline silicon and titanium that are commonly used as conductors in integrated circuits oxidize in such anneals and become insulators. This creates thin capacitors in areas where they are not desirable. Stack capacitors used in DRAM cells contain barrier and contact materials, such as Ti, TiN, $TiSi_2$, TaN, WN and $CoSi_2$, which are prone to oxidation in an $O_2$ environment above 400° C. Exposure to oxygen at high temperatures can also lead to defects in many other materials used in integrated circuits, such as semiconducting silicon.

The prior art has attempted to avoid some of the destructive effects of high temperature oxygen anneals by device designs which isolate the complex oxides from the transistors and other sensitive conventional integrated circuit components. See for example, E. Fujii et al., "ULSI DRAM Technology with $Ba_{0.7}Sr_{0.3}TiO_3$ Film of 1.3 nm Equivalent $SiO_2$n Thickness and $10^{-9}$ $A/cm^2$ Leakage Current", in *IEDM Technical Digest,* pp. 267–270, 1992, which locates the BST capacitors on a thick protective coating well above and away from the transistor. This however, results in an integrated circuit that is less dense than it could otherwise be. Other prior art has used barrier layers to attempt to avoid damaging the sensitive integrated circuit components, but as discussed above, the barrier layers are also susceptible to damage by the high temperature oxygen anneals. Thus, it would be highly desirable to have a fabrication process that produces high quality BST electronic devices without using a high temperature oxygen anneal or otherwise exposing the integrated circuit to oxygen at temperatures above 400° C.

3. Solution to the Problem

The present invention provides a process for fabricating BST thin films for use in integrated circuits that exposes the integrated circuit to oxygen only at temperatures of 400° C. or preferably less, and at the same time provides high quality layered integrated circuit devices utilizing BST materials.

The invention provides a method of fabricating a crystalline BST thin film, comprising the steps of: providing a substrate; forming a thin film containing barium, strontium and titanium on said substrate, and heating the thin film in an oxygen-free atmosphere at a temperature of between 500° C. and 900° C. to form a solid thin film of BST on the substrate. Preferably, the substrate is pre-baked in a nitrogen atmosphere before application of the precursor. Preferably, the step of heating comprises annealing at a temperature of about 800° C. in a nitrogen atmosphere for about thirty minutes. Preferably, the substrate comprises a first electrode, and the method further comprises the steps of forming a second electrode on the BST thin film, after the step of annealing, to form a capacitor, and subsequently performing a second anneal in an oxygen-free atmosphere at a temperature of between 650° C. and 900° C. Preferably, the second anneal temperature is about 800° C. and is in a nitrogen atmosphere. Preferably, the method also includes the step of drying the precursor film in air at a temperature of between 140° C. and 400° C. Preferably the step of forming comprises providing a precursor liquid including barium, strontium and titanium moieties in effective amounts for forming BST, and applying the precursor to the substrate to form a precursor film, while the step of heating comprises drying and annealing the precursor thin film.

In an alternative method the substrate is prebaked in oxygen at a temperature of 700° C. or less, and preferably at about 650° C., prior to applying the precursor.

The preferred method described above exposes the integrated circuit including the BST thin film to oxygen only at temperatures of 400° C. or lower, yet results in thin films of BST with excellent electronic properties. For example, using the preferred method, a capacitor was fabricated comprising a thin film of BST approximately 1500 Å thick and possessing a capacitance of $2\times10^{-14}$ to $3\times10^{-14}$ Farad per square micrometer and leakage currents of less than $10^{-7}$ amps per centimeter squared over the 1 volt to 5 volt range of operation of conventional DRAM memories. The method of the invention provides the advantages of a high-temperature anneal, while reducing concerns about oxidation of semiconductive, contact and barrier layers in the capacitor or other parts of the integrated circuit. Thus, the invention is important for the development of high density DRAM cells utilizing high dielectric constant materials in capacitors. Numerous other features, objects and advantages of the invention will become apparent from the following description when read in conjunction with the accompanying drawings.

DESCRIPTION OF THE PREFERRED EMBODIMENT

1. Overview

Figure 2:
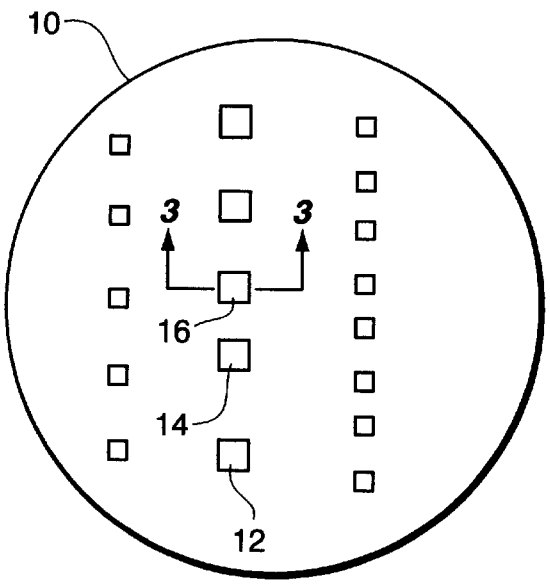
FIG. 2 is a top view of a wafer on which thin film capacitors fabricated by the process according to the invention are shown greatly enlarged.
Figure 3:
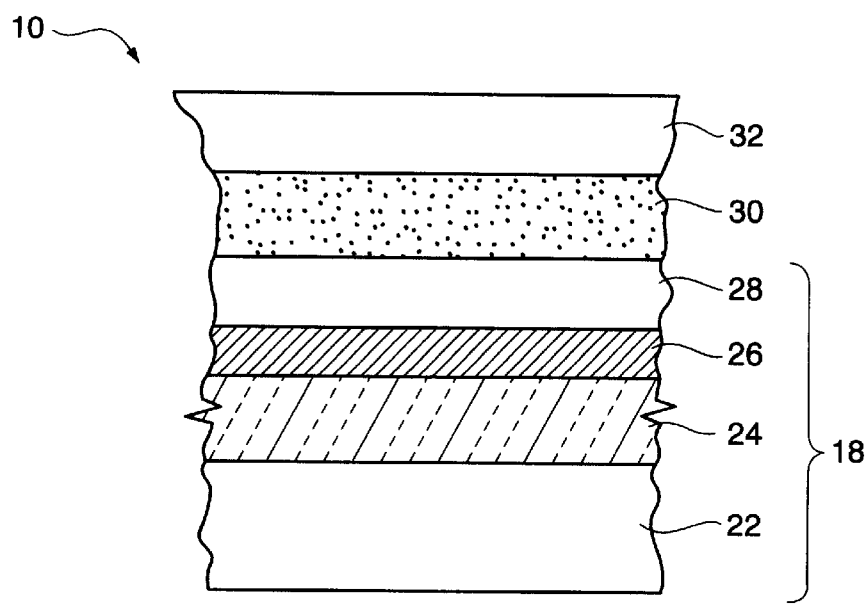
FIG. 3 is a portion of a cross-section of FIG. 2 taken through the lines 3—3, illustrating a thin film capacitor device fabricated by the process of FIG. 1.

Directing attention to FIGS. 2 and 3, a wafer 10 containing numerous capacitors 12, 14, 16, etc. is shown. FIG. 2 is a top view of the wafer 10 on which the thin film capacitors 12, 14, 16, etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a silicon substrate 22, a silicon dioxide insulating layer 24, a thin adhesion layer of titanium 26 which assists the layer above it in adhering to the silicon dioxide 24, a platinum electrode 28, a thin film of BST 30, and another platinum electrode 32. After the layers 24, 26, 27, 28, 30, and 32 are deposited, the wafer is etched down to layer 32 to form the individual capacitors 12, 14, 16, etc. which are interconnected by the bottom electrode 28. The invention primarily involves the method of creating the layer 30 of BST.

Figure 4:
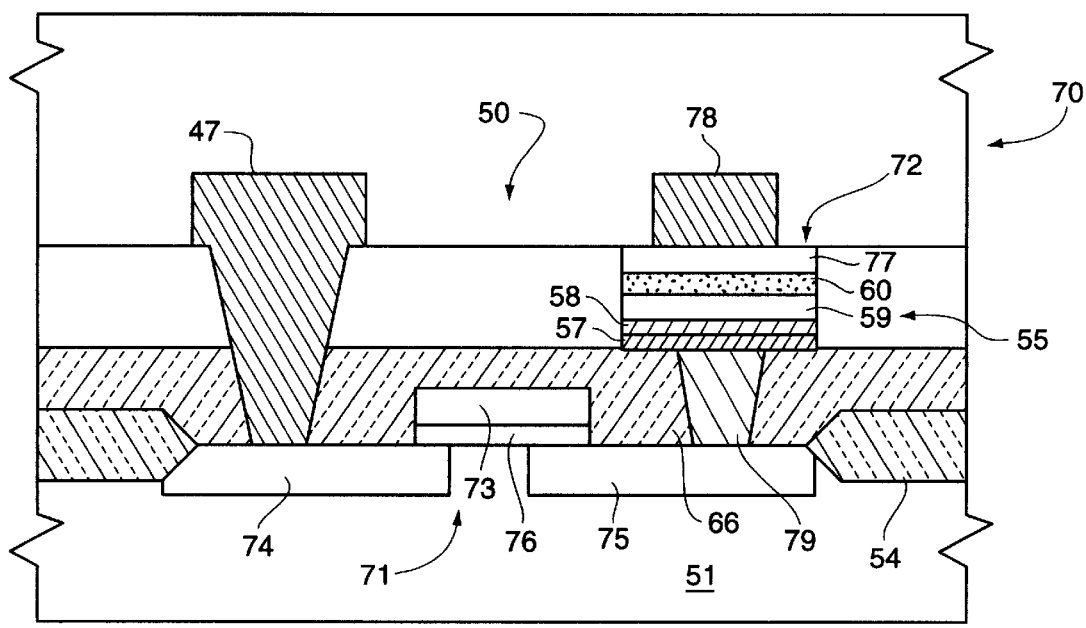
FIG. 4 is a cross-sectional illustration of a portion of an integrated circuit showing a stacked capacitor fabricated utilizing the process of the invention.

FIG. 4 shows an example of the integration of a BST capacitor 72 into a DRAM memory cell to form an integrated circuit 70 such as may be fabricated using the invention. The memory cell 50 includes a silicon substrate 51, field oxide areas 54, and two electrically interconnected electrical devices, a transistor 71 and a stack capacitor 72. Transistor 71 includes a gate 73, gate oxide 76, a source 74, and a drain 75. Capacitor 72 includes first electrode 55, preferably comprising a titanium adhesion layer 57, a titanium nitride barrier layer 58, and a platinum layer 59, a dielectric thin film of BST 60, and second electrode 77. Insulators, such as 66, separate the devices 71, 72, except where drain 75 of transistor 71 is connected to first electrode 55 of capacitor 72 by polycrystalline silicon plug 79. Electrical contacts, such as 47 and 78 make electrical connection from the devices 71, 72 to other parts of the integrated circuit 70. A detailed example of the complete fabrication process for an integrated circuit DRAM memory cell is given in U.S. Pat. No. 5,561,307 issued Oct. 1, 1996, which is incorporated herein by reference. It should be understood that FIGS. 2, 3, 4 depicting the capacitors 12, 14, 16, etc. and integrated circuit 70 are not meant to be actual cross-sectional views of any particular portion of an actual electronic device, but are idealized representations which are employed to more clearly and fully depict the structure and process of the invention than would otherwise be possible.

This disclosure describes the fabrication and testing of capacitors 12, 14, 16 having layers 30 made of BST. It should be understood, however, that the specific processes and electronic devices described are exemplary; that is, the invention contemplates that the layers in FIGS. 3 and 4 may be made of many other materials than those mentioned above and described below, there are many other variations of the process of the invention too numerous to be included in a document such at this, and the method and materials may be used in many other electronic devices other than the capacitors, such as 12, 14, 16, etc. and the integrated circuit 70. It should also be noted that the word "substrate" is used in both a specific and a general sense in this disclosure. In the specific sense it refers to the specific silicon layer 22, conventionally called a silicon substrate, on which the exemplary electronic devices described are fabricated. In a general sense, it refers to any material, object, or layer on which another layer or layers are formed. In this sense, for example, the layers 22, 24, 26, 27, and 28 comprise a substrate 18 for the layer 30 of BST.

A term that is used in this disclosure is "stoichiometry" or "stoichiometric". As used herein, the term stoichiometric generally expresses a relationship between the precursor solution and the final BST thin film 30. A "stoichiometric precursor" is one in which the relative proportions of the various metals in the precursor is the same as the proportion in a homogeneous specimen of the intended final BST thin film 30. This proportion is the one specified by the formula for the final thin film 30.

Another term that is used in this disclosure is "thin film". It should be understood that in the integrated circuit art the term "thin film" refers to layers less than a micron in thickness, and preferably less than 0.5 microns. These films are much thinner than so called "thin films" used in elements of hybrid devices, the manufacture of which involves an entirely different art than the manufacture of integrated circuits.

In this disclosure "low temperature" with respect to heating of an integrated circuit or a portion of an integrated circuit means a temperature of 400° C. or less, while "high temperature" means a temperature of 700° C. or higher.

The BST disclosed in the examples in this disclosure is not ferroelectric, and preferably is paraelectric. This material is a high dielectric constant material the preferred use of which is dielectric charge storage devices, that is, charge storage devices that operate on a dielectric rather than ferroelectric principal.

2. Detailed Description of the Fabrication Process

Figure 1:
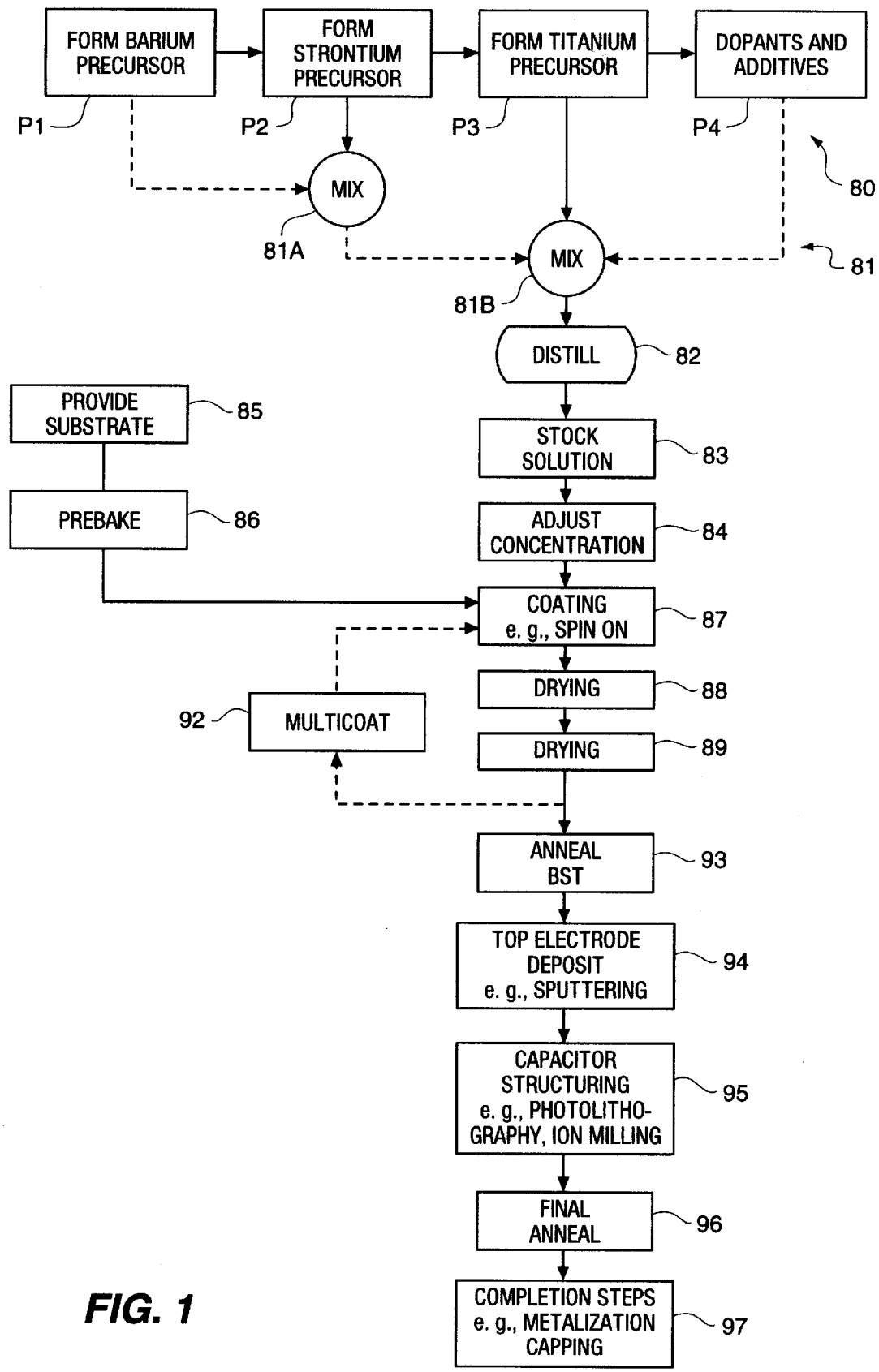
FIG. 1 is a flow chart showing the preferred embodiment of a process for preparing a thin film of BST according to the invention.

Turning now to a more detailed description of the invention, a flow chart of the preferred embodiment of a process according to the invention for preparing a thin film of BST, such as 30 and 60, and a device, such as 10 and 70 incorporating the thin films 30 and 60, is shown in FIG. 1. We shall first review each step of the preferred process and then provide examples of the process. The first step 80 of the process is the preparation of the precursor or precursors, P1, P2, P3, etc. In the preferred embodiment the precursors are liquids in which a compound or compounds of the metals to comprise the BST thin film 30 are dissolved. The precursor liquid solution may be obtained by preparing precursors P1, P2, P3 for each element using alkoxide chemistry, carboxylic acid chemistry, or other wet chemistry techniques, which lead to a common solvent. Optionally, one or more precursors P4 containing dopants and additives may be added also. The precursors for the individual metals and the dopants and additives are then mixed in step 81, preferably by a series of mixing steps 81A and 81B in the same container, or by a single mixing step in which all metals and solvents are mixed together. The mixed precursors are distilled in step 82 to make a stock solution 83, which may be stored for long periods without significant deterioration. In the preferred precursor liquid, the barium, strontium and titanium are contained in one or more precursor chemical compounds in solution with the common solvent. Such precursors for BST are now commercially available from Kojundo Chemical Laboratory Co. Ltd., No. 1-28 5 Chome, Chiyoda, Sakadoshi, Saitama Pref. Japan. A detailed example of the preparation of a BST precursor and the chemistry involved is given in U.S. Pat. No. 5,514,822 issued May 7, 1996, which is hereby incorporated by reference.

Just prior to deposition the stock solution, whether it be a specially prepared solution or a commercial one, is adjusted for optimal deposition in a solvent control and/or concentration control step 84. The final precursor contains metal moieties in effective amounts for spontaneously forming the desired thin film of BST upon drying and annealing the precursor.

In parallel with the solvent and concentration control step 84, the substrate 18 is prepared. Almost any substrate that will support a thin film and is compatible with the materials and processes described herein may be used. Some of these substrates include oxidized or non-oxidized silicon or gallium arsenide semiconducting wafers, with or without integrated circuits and/or metallized layers added, plates of silicon or glass, and other electronic device chips. For the exemplary devices of this disclosure, the substrates were metallized substrates, similar to substrate 18 in FIG. 3. These substrates are provided in step 85 by forming the layers 22, 24, 26, 27, and 28 and are then prebaked in step 86. If the substrate is a silicon, gallium arsenide, or other semiconducting wafer, it is prepared by forming active areas as known in the art and prebaked or otherwise dehydrated in step 86. In step 87 the substrate is coated with the precursor. In the examples discussed below, the coating was done by a spin-on process, though a process such as a misted deposition process as described in U.S. Pat. No. 5,456,945 issued Oct. 10, 1995, which is hereby incorporated by reference, or dipping or other suitable coating process may be used. The coated substrate is then dried, preferably in two steps 88 and 89 which are at different temperatures, though one drying step or three or more drying steps may also be used. If the desired thickness of the layer 30 is not obtained, then the series of coat and dry steps 87, 88 and 89 are repeated as many times as required to build up the desired thickness, as indicated at 92. The wafer 10 is then annealed in step 93, and the top or second electrode 32 is deposited in step 94 by sputtering or other suitable process. The wafer may, optionally, be annealed after the top electrode is formed and prior to patterning, though this is not done in the preferred process. The capacitor 16 is then patterned or structured by ion milling, chemical etching, or other suitable process in step 95. Then follows, in step 96, a final anneal step. This completes the process if an integrated set of capacitor devices as in FIG. 2 is the desired end result; however, in the case of an integrated circuit as in FIG. 4, there follows completion steps 97 such as contact metalization, capping, etc. As will be discussed further below, not all of the steps outlined above are necessary for every device: some steps are optional and others are used only for certain BST capacitors. It is a feature of the invention that the heating steps after deposition of the BST thin film 30, 60, i.e. the dry steps 88 and 89, the first anneal step 92, and the final anneal step 96, and the optional top electrode anneal if it is done, all involve either temperatures of 400° C and lower, or the heating is done in an oxygen-free atmosphere, preferably nitrogen.

While the preferred process is a liquid deposition process, the invention also contemplates that the coating step 87 may comprise other methods, such as sputtering, chemical vapor deposition (CVD), particularly metalorganic CVD (MOCVD), and laser ablation. These are all well-known methods of depositing BST. In these cases, the drying steps 88 and 89 are omitted and the anneal step 93 and the following steps are performed as described in this disclosure.

Turning now to the details of the fabrication process, while a platinum layer 28 with a titanium adhesion layer 26 are the metallizations used in the examples discussed, numerous other metals may be used such as platinum with an adhesion layer of tantalum, tungsten, molybdenum, chromium, nickel or alloys of these metals, and titanium nitride. Sputtering or vacuum deposition are the preferred metallization deposition processes, though other metallization processes may be used. Heating of the substrates during the metallization deposition is effective to increase adhesion. The preferred prebaking step 86 comprises baking the substrate in either an inert atmosphere or an oxygen atmosphere. Preferably the prebaking step 86 is done in nitrogen or another inert gas at a temperature between 400° C. and 1000° C., and preferably 450° C., prior to the coating step 87. If the prebaking is done in the presence of oxygen, preferably at a concentration of between 20% and 100%, then it should be done at a temperature of 400° C. or less if oxidation of other integrated circuit materials already deposited will create a problem. Preferably the wafer 10 is baked in a diffusion furnace. The substrate prebake step 86 removes water and organic impurities from the substrate surface. More importantly, the prebaking decreases the internal stress of the metal layer 28 through the annealing effect of the prebaking and the interdiffusion of the adhesion layer 26 metal. All this increases the adhesion between the substrate 18 and the BST thin film 30 and minimizes peeling. Further, if the adhesion layer 26 is a transition metal, the prebaking stabilizes the metal chemically. Therefore, the number of mobile atoms penetrating into the BST thin film 30 through the platinum layer 28 is drastically decreased, and the BST thin film 30 crystallizes smoothly without defects due to the diffused ions. If the substrate is not metallized, then the silicon or other wafer is dehydrated in step 86 at a lower prebake temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably the coating is done by a spin-on process. The preferred precursor solution concentration is 0.01 to 0.50 M (moles/liter), and the preferred spin speed is between 500 rpm and 5000 rpm for from 5 seconds to five minutes, most preferably 2500 rpm for thirty seconds.

The spin-on process and the misted deposition process remove some of the solvent, but some solvent remains after the coating. This solvent is removed from the wet film in drying steps 88 and 89. At the same time, the heating causes thermal decomposition of the organic elements in the thin film, which also vaporize and are removed from the thin film. This results in a solid thin film of BST 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between the boiling point of the solvent and 400° C. and depends on the specific precursor used. The drying is preferably done in two steps 88 and 89, although it also may be done in one step or in more than two steps. The multiple step drying process is useful to prevent cracking and bubbling of the thin film which can occur due to excessive volume shrinkage by too rapid temperature rise. Preferably the first drying step 88 is a relatively low temperature step, preferably at a temperature of from 140° C. and 180° C. for from 1 to 5 minutes, and most preferably at about 160° C. for three minutes. Preferably the second drying step is at a temperature of from 200° C. to 400° C. for from 2 minutes to 8 minutes, and most preferably at a temperature of about 400° C. for about 3 minutes. Preferably the drying is performed on a hot plate in air.

The thickness of a single coat, via the spin process or otherwise, is very important to prevent cracking due to volume shrinkage during the following heating steps 88 through 91 and 93. To obtain a crack-free, film, a single spin-coat layer should preferably be less than 2000 Å(200 nanometers) after the bake step 89. Therefore, multiple coating is necessary to achieve film thicknesses greater than 2000 Å.

Once the desired film thickness has been obtained, the dried and preferably baked film is annealed in step 93, which is referred to as a first anneal to distinguish it from subsequent anneals. The first anneal is preferably performed in a furnace in an inert atmosphere, preferably nitrogen and/or a noble gas, such as argon, and most preferably nitrogen. The first anneal can also be performed in a Rapid Thermal Processing ("RTP") apparatus, instead of a furnace. The temperature of the first anneal step 93 is above the crystallization temperature of the thin film of BST 30, 60. To prevent evaporation of components from the thin film 30, 60 and to prevent thermal damage to the substrate, including damage to integrated circuits already in place, the annealing temperature is preferably kept below 900° C. Preferably, the annealing for BST is done at between 700° C. and 900° C. The time for the anneal can vary from an anneal with only the push/pull cycle, to a 20 hours or more holding time plus the push/pull cycle. Most preferably, for BST, the anneal is done at a temperature of about 800° C. for 60 minutes, with a ten minute push/pull for a low thermal budget.

After the first anneal, the second or top electrode 32 is formed. Preferably the electrode is formed by DC sputtering of a platinum single layer, but it also may be formed by RF sputtering, ion beam sputtering, vacuum deposition or other appropriate deposition process. If desirable for the electronic device design, before the metal deposition, the BST thin film 30 may be patterned using conventional photolithography and etching, and the top electrode 32 is then patterned in a second process after deposition. In the examples described herein, the top electrode 32 and BST thin film 30 are patterned together using conventional photolithography techniques and ion beam milling.

As deposited, the adhesion of the top electrode 32 to the BST thin film 30 is usually weak. Preferably, the adhesion is improved by a heat treatment. The wafer 10 including the BST thin film 30 covered by the top electrode 32 may be annealed before the patterning step 95 described above, but preferably is annealed in step 96 only after the patterning step 95. The final anneal step 96 is preferably performed in an electric furnace at a temperature between 650° C. and 850° C., and most preferably at 800° C. or lower. The anneal is most preferably performed with a 10 minute push/pull and with a holding time of about 30 minutes. The anneal time may range from only the ten minute push/pull cycle, with no holding time, to a 60 minute holding time together with the push pull. The anneal step 96 is again preferably done in an atmosphere of nitrogen and/or a noble gas, such as argon, and most preferably in nitrogen. The final anneal releases the internal stress in the top electrode 32 and in the interface between the electrode 32 and the BST thin film 30. At the same time, the second annealing step 96 reconstructs microstructure in the BST thin film 30 resulting from the sputtering of the top electrode, and as a result improves the properties of the material.

3. Examples of the Fabrication Process

Below, examples of the fabrication process according to the invention as applied to a wafer 10 as shown in FIGS. 2 and 3 are given. Following each of the examples, there is a discussion of the electrical/electronic properties illustrated in the figures. The figures include capacitance curves, such as FIG. 5, and current leakage curves, such as in FIG. 6. The capacitance curves are given in terms of the capacitance, farads per micro-meter squared ($F/\mu m^2$) versus applied voltage. The current leakage curves are given in terms of amps per squared centimeter ($A/cm^2$) versus applied voltage.

EXAMPLE 1

A capacitor was fabricated in which the dielectric material comprised a thin film 30 of BST, as shown in FIGS. 2 and 3. It was fabricated essentially according to the preferred process described above in connection with the flowsheet of FIG. 1. A stock precursor solution of 0.5M concentration of BST was prepared approximately 5 months prior to the experiment. Shortly before use, the stock solution was diluted with n-butyl acetate solvent to 0.35M BST. A substrate 18 comprising a single crystal silicon layer 22, a 500 nanometer (nm) thick layer 24 of silicon dioxide, a 20 nm thick layer 26 of titanium, and a 200 nm thick layer 28 of platinum was prebaked at 450° C. in a diffusion furnace for 30 minutes, 10 minutes push-pull, with a nitrogen flow of 5 l/m, step 86 of FIG. 1. The platinum electrode had a sheet resistance of 0.807 Ω/sq. A disposable pipette was used to place 1 ml of the BST solution on the substrate 18. The wafer was spun at 2500 RPM for 30 seconds, step 87. The substrate 18 was then placed on a hot plate and baked in air at about 160° C. for 3 minutes in step 88 and then at 400° C. in air for another 3 minutes in step 89. The steps 87–89, from using a disposable pipette through the second drying, were repeated as in step 92, to add a second coating of BST. The wafer was then transferred to a diffusion furnace and annealed in step 93 at 800° C. with a nitrogen flow of 5 l/m for 60 minutes with 10 minutes push-pull. The top layer 32 of 200 nm platinum was sputtered, step 94. Then, in step 95, a resist was applied, followed by a standard photo mask process, an ion mill etch, and an IPC strip at 350 Watts or 40 minutes. Finally, in step 96, the capacitor was annealed at 800° C. in a nitrogen flow of about 5 l/min for 30 minutes, with 10 minutes push-pull. The final thickness of the BST dielectric layer 30 was about 1425 Å, as measured by a Film Thickness Isoscope ($Si_3N_4$ plate, conv. fact. 0.95), and the area of the capacitor was about 196000 micrometers squared.

Figure 5:
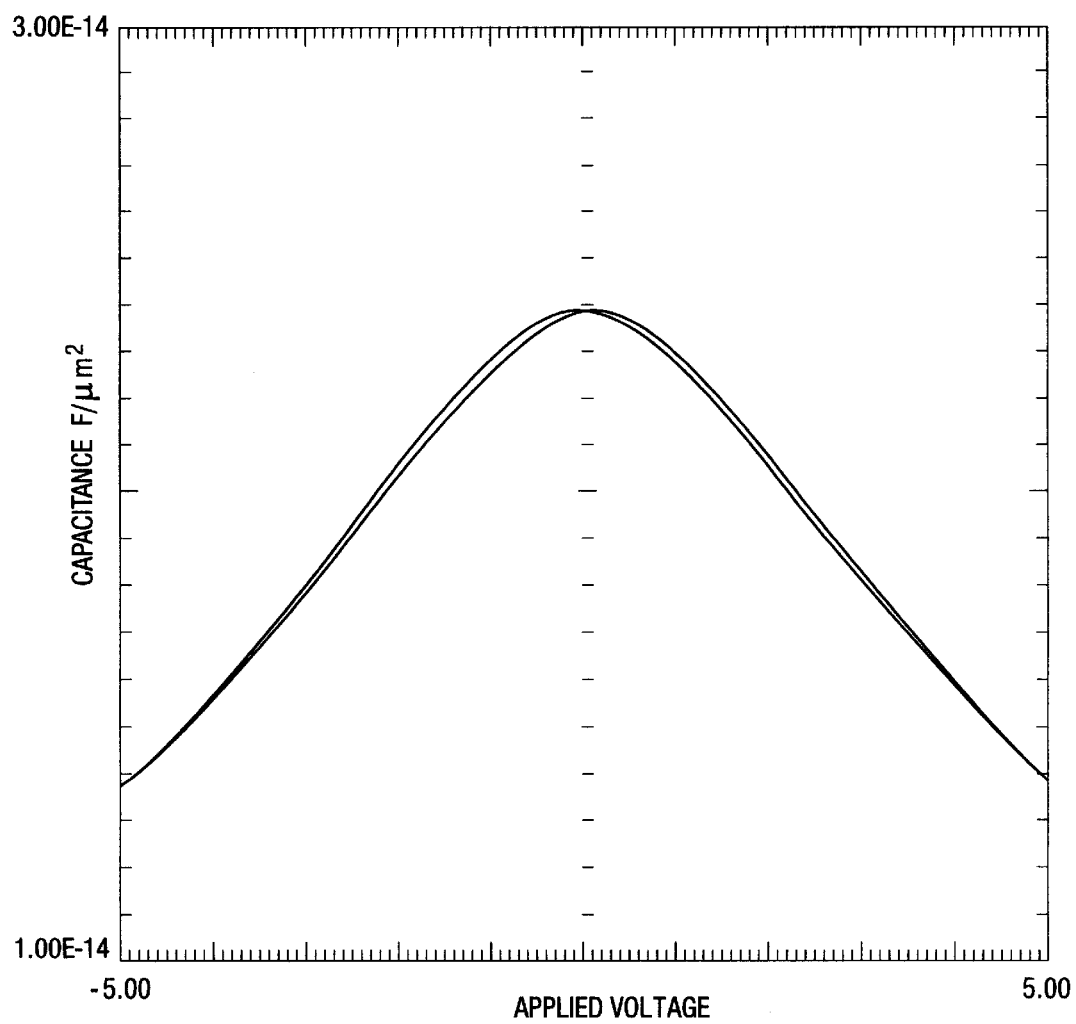
FIG. 5 is a graph of capacitance versus voltage as measured for a capacitor fabricated according to the preferred method of this invention.
Figure 6:
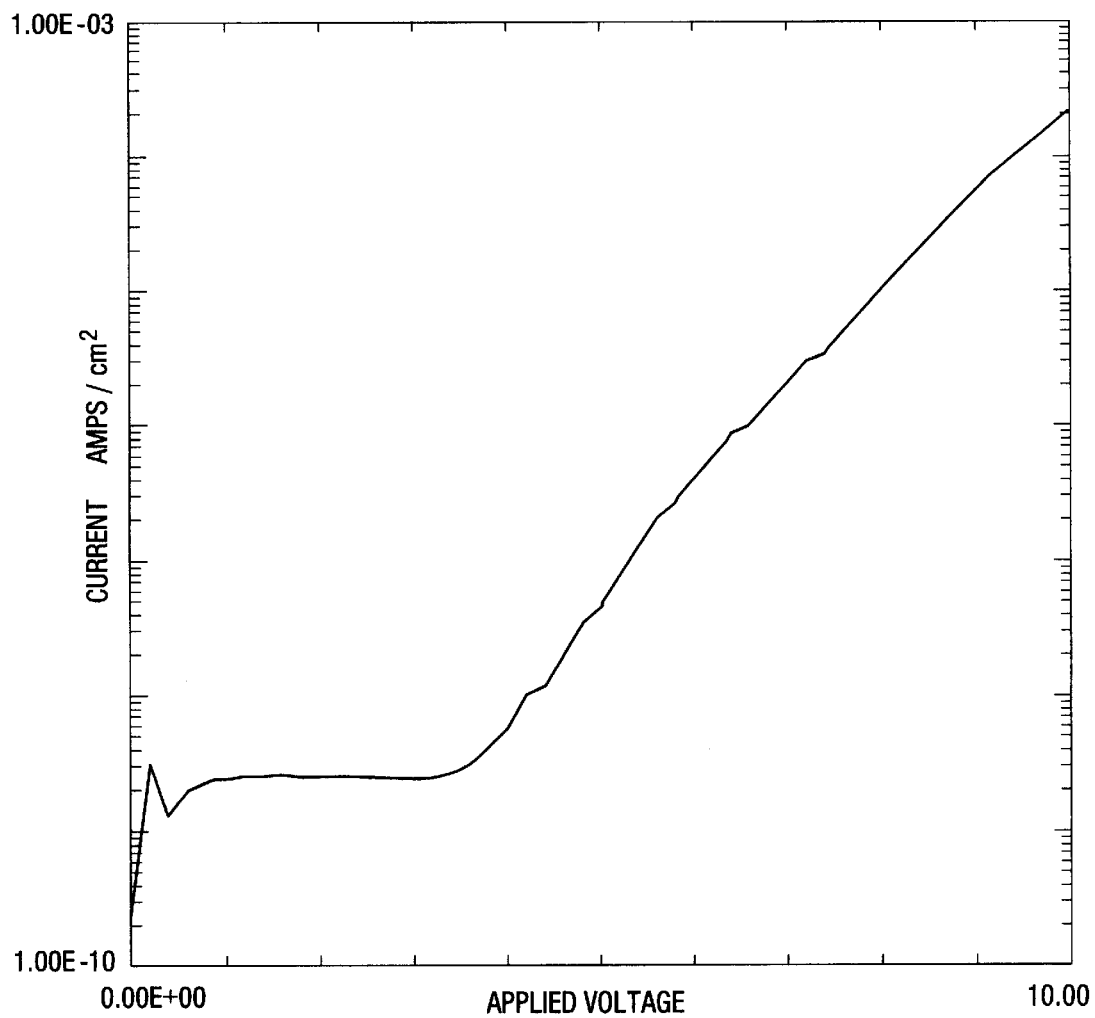
FIG. 6 shows a graph of leakage current versus voltage as measured for the same capacitor utilized in the measurement of FIG. 5.

FIG. 5 shows that the capacitance per micro-meter squared of the capacitor in Example 1 was about $1.4 \times 10^{-14}$ farads at plus or minus 5.0 volts, and reached a maximum of about $2.4 \times 10^{-14}$ farads near zero voltage. FIG. 6 shows a graph of the leakage current in amperes per centimeter squared versus the applied voltage for the sample of Example 1. The leakage current rises to about $2 \times 10-9$ amps per $cm^2$ at about 0.5 volts and stays flat out to about 3.5 volts, and then rises to about 5×10−7 amps per cm$^2$ at about 6 volts. Since the operating voltage of a conventional memory is about 3–5 volts, and any leakage current below 10$^{-6}$ volts results in good memory performance, these results show that materials made by the process of Example 1 make excellent dielectric memories.

EXAMPLE 2

A capacitor was fabricated using the same process as in Example 1 except that the prebaking of the substrate in step 86 was done in oxygen at a flowrate of 5 l/m, instead of nitrogen, and the furnace temperature was 650° C., instead of 450° C. As in Example 1, the final thickness of the BST dielectric layer was about 1425 Å, as measured by a Film Thickness Isoscope ($Si_3N_4$ plate, conv. fact. 0.95), and the area of the capacitor was about 196000 micrometers squared.

The capacitance per micro-meter squared of the capacitor in Example 2 was about $1.4\times10^{-14}$ farads at plus or minus 5.0 volts, and reached a maximum of about $2.9\times10^{-14}$ farads near zero voltage. The leakage current in amperes per centimeter squared versus the applied voltage in volts for the sample of Example 2 rose to about $3\times10^{-9}$ amps per cm$^2$ at about 0.5 volts and stayed flat out to about 2.0 volts, and then rose to about $4\times10^{-7}$ amps per cm$^2$ at about 3 volts and $1\times10_{-4}$ amps per cm$^2$ at about 5 volts. Since most integrated circuits are currently being designed to operate at about 3 volts, the measured electronic properties of this capacitor are also suitable for a good DRAM memory.

The above two examples show that the sample using no oxygen in heating steps over 400° C. provides somewhat lower capacitance values and somewhat better leakage current values than a sample made with an oxygen prebake at 650° C. However, the measurements made on the capacitor do not include whether the prebaking of the substrate in the presence of oxygen would cause undesirable effects in the substrate layers. In integrated circuit fabrication processes in which the integrated circuit substrate and/or other devices and materials on the substrate are highly sensitive to oxygen, then the no oxygen process of Example 1 would be preferred. However, a 650° C. temperature is significantly less than the temperatures of oxygen anneals used in the prior art. Further, there are some integrated circuit structures and processes that may not be damaged significantly by a 650° C. oxygen bake, but would be damaged significantly by the relatively high temperature oxygen anneals of the prior art. In such cases, the process of Example 2 may be preferred.

There has been described processes and compositions for making electronic devices utilizing thin films of BST using process steps in which heating of BST deposited on a substrate is performed only in an inert atmosphere, such as nitrogen, for process temperatures of greater than 400° C. There has also been described a preferred method in which the substrate provided for deposition of BST is heated only in an inert atmosphere if the heating temperature is above 400° C., and a less preferred method in which the substrate is prebaked in oxygen at a temperature of 650° C. Considering the fact that no example of making a BST thin film of acceptable electronic quality for making an integrated circuit without using a high temperature oxygen anneal has been shown in the prior art, and, in fact, the prior art teaches that the high temperature oxygen anneal is essential to obtain high electronic quality thin films of these materials, it is surprising that such results have been obtained. These results are highly encouraging for the integration of BST into an otherwise conventional CMOS or other integrated circuit process, since the possibilities of oxidizing the silicon and metallic materials used in the conventional process is dramatically reduced by the process of the invention. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it has been shown that a process in which no high temperature oxygen anneal of the BST or of the starting metallized substrate is used can result in superior electronic quality thin films, these processes can be combined with conventional processes using various known barrier layers etc. to provide variations on the processes described. It is also evident that the steps recited may in some instances be performed in a different order. Or equivalent structures and process may be substituted for the various structures and processes described. Or a variety of different dimensions and materials may be used. Consequently, the invention is to be construed as embracing each and every novel feature and novel combination of features present in and/or possessed by the fabrication processes, electronic devices, and electronic device manufacturing methods described.

We claim:

1. A method of fabricating a thin film of barium strontium titanate, said method comprising the steps of:
   (a) providing a substrate;
   (b) forming a thin film containing barium, strontium, oxygen, and titanium on said substrate; and
   (c) heating said thin film in an oxygen-free atmosphere at a temperature of between 500° C. and 900° C. to form a solid thin film of said barium strontium titanate on said substrate.

2. A method as in claim 1 wherein said atmosphere comprises nitrogen.

3. A method as in claim 1 wherein said step of heating comprises annealing in an inert atmosphere at between about 700° C. and 900° C.

4. A method as in claim 3 wherein said step of annealing comprises annealing at a temperature of about 800° C. in a nitrogen atmosphere.

5. A method as in claim 1 wherein said substrate comprises a first electrode, and further comprising the steps of forming a second electrode on said thin film of barium strontium titanate, after said step of annealing, to form a capacitor, and subsequently performing a second anneal in an oxygen-free atmosphere at a temperature of between 650° C. and 900° C.

6. A method as in claim 5 wherein said second anneal temperature is about 800° C. and is in a nitrogen atmosphere.

7. A method as in claim 1 wherein said step of forming a thin film comprises:
   providing a precursor containing metal moieties and an organic compound containing said oxygen in effective amounts for spontaneously forming barium strontium titanate upon heating said precursor; and applying said precursor to said substrate to form a precursor thin film; and wherein said step of heating comprises heating said precursor thin film.

8. A method as in claim 7 and further comprising the step of drying said precursor film in air at a temperature of between 140° C. and 320° C. before said heating step.

9. A method as in claim 7 wherein said step of drying comprises a first drying step performed at a temperature of between 140° C. and 180° C. for 0.5 minutes to 4 minutes and a second drying step performed at a temperature of between 200° C. and 400° C. for from 3 minutes to 8 minutes.

10. A method as in claim 1 wherein said step of providing a substrate comprises forming an adhesion layer and then forming a first electrode on said adhesion layer.

11. A method as in claim 1, further comprising the step of prebaking said substrate by heating the substrate at a temperature of between 200° C. and 900° C. prior to applying said precursor.

12. A method as in claim 11, wherein said step of prebaking is performed in an inert atmosphere.

13. A method as in claim 11, wherein said step of prebaking is performed in a nitrogen atmosphere.

14. A method as in claim 11, wherein said step of prebaking is performed in an oxygen-containing atmosphere.

15. A method as in claim 14, wherein said step of prebaking in oxygen is performed at a temperature of 400° C. or less.

16. A method as in claim 14 wherein said step of prebaking is performed at a temperature of from 600° C. to 700° C.

17. A method as in claim 16 wherein said step of prebaking is performed at a temperature of substantially 650° C.

18. A method as in claim 1 wherein said step of forming comprises a process selected from the group consisting of sputtering, chemical vapor deposition, and laser ablation.

19. A method of fabricating a thin film of barium strontium titanate (BST) comprising:

(a) providing a substrate;

(b) forming a thin film containing barium, strontium, oxygen, and titanium on said substrate; and (c) heating said thin film on said substrate to a temperature of higher than 600° C. without exposing it to oxygen to form said BST thin film on said substrate.

20. A method as in claim 19 wherein said step of heating is performed without exposing said solid film to oxygen while at a temperature higher than 400° C.

21. A method as in claim 19 and further including the step of prebaking said substrate in an inert atmosphere prior to said step of forming.

22. A method as in claim 19 and further including the step of prebaking said substrate at a temperature of 700° C. or less in an atmosphere containing oxygen prior to said step of forming.

23. A method as in claim 19 wherein said step of forming comprises providing a precursor containing metal moieties and an organic compound containing said oxygen in effective amounts for spontaneously forming barium strontium titanate upon heating said precursor; and applying said precursor to said substrate to form a precursor thin film; and wherein said step of heating comprises heating said precursor thin film.

24. A method as in claim 23 wherein said step of heating said precursor thin film includes the steps of drying and then annealing said precursor thin film.

25. A method as in claim 19 wherein said step of forming comprises a process selected from the group consisting of sputtering, chemical vapor deposition, and laser ablation.

\* \* \* \* \*